(12) United States Patent
Jeong et al.

(10) Patent No.: US 12,096,591 B2
(45) Date of Patent: Sep. 17, 2024

(54) DEVICE FOR FIXING COMMUNICATION EQUIPMENT

(71) Applicant: Samsung Electronics Co., Ltd., Suwon-si (KR)

(72) Inventors: Sun Young Jeong, Suwon-si (KR); Gi Chun Nam, Suwon-si (KR); Hyun Suk Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 850 days.

(21) Appl. No.: 16/762,089

(22) PCT Filed: Oct. 30, 2018

(86) PCT No.: PCT/KR2018/013041
§ 371 (c)(1),
(2) Date: Nov. 22, 2021

(87) PCT Pub. No.: WO2019/093704
PCT Pub. Date: May 16, 2019

(65) Prior Publication Data
US 2022/0071047 A1    Mar. 3, 2022

(30) Foreign Application Priority Data

Nov. 9, 2017 (KR) .......................... 10-2017-0148693

(51) Int. Cl.
*H05K 7/18* (2006.01)
(52) U.S. Cl.
CPC .................................... *H05K 7/186* (2013.01)

(58) Field of Classification Search
CPC ...... A47F 5/04; A47F 5/05; A47F 5/06; A47F 2005/026; F16M 11/041; F16M 13/02;
(Continued)

(56) References Cited

U.S. PATENT DOCUMENTS 3,734,438 A * 5/1973 Kautz ..................... H02B 5/02
248/219.4
4,117,629 A * 10/1978 Ekdahl ..................... A01G 9/02
248/214
(Continued)

FOREIGN PATENT DOCUMENTS

EP    2309832 A1    4/2011
JP    H06-083845 U    12/1899
(Continued)

OTHER PUBLICATIONS

International Search Report dated Feb. 25, 2019 in connection with International Patent Application No. PCT/KR2018/013041, 2 pages.
(Continued)

*Primary Examiner* — Joshua E Rodden

(57) ABSTRACT

The present invention proposes a device for fixing communication equipment, which couples communication equipment with a communication pole, the device including: a plurality of fixing brackets which surround an outer circumferential surface of a communication pole and are coupled to each other so as to be coupled to the communication pole; a fastening groove which is formed at each of the fixing brackets and coupled to a connecting bracket; a fixing groove connected to the fastening groove; and a fixing assembly which is disposed at the fixing groove and includes a leaf spring which protrudes toward the fastening groove or is inserted into the fixing groove. Other embodiments are also possible.

17 Claims, 24 Drawing Sheets

(58) Field of Classification Search
CPC .. F16M 13/022; F16M 13/025; F16M 13/027; G09F 2007/1804; G09F 2007/1821; G09F 2007/1826; H01Q 1/106; H02B 5/02; H05K 7/18; H05K 7/183; H05K 7/186
USPC .................. 211/26, 107, 110, 111, 196, 205; 248/218.4, 219.1, 220.21, 223.41, 225.11
See application file for complete search history.

(56) References Cited

U.S. PATENT DOCUMENTS

| | | | | |
|---|---|---|---|---|
| 4,781,348 | A * | 11/1988 | Cutforth | H01F 27/06 211/26 |
| 5,320,312 | A * | 6/1994 | Hoenninger | F16L 3/227 248/68.1 |
| 6,971,199 | B2 * | 12/2005 | Kim | G09F 7/22 40/607.14 |
| 8,083,192 | B2 * | 12/2011 | Wells | G09F 15/0018 248/219.3 |
| 8,191,840 | B2 * | 6/2012 | Jenestreet | F21V 21/116 24/20 R |
| 8,226,057 | B2 * | 7/2012 | Ao | H01Q 1/1228 248/218.4 |
| 10,797,372 | B2 * | 10/2020 | Hemmervall | F16G 13/18 |
| 11,105,461 | B2 * | 8/2021 | Deng | H04B 1/38 |
| 2003/0066812 | A1 * | 4/2003 | Dziedzic | H01F 27/06 248/230.1 |
| 2006/0284036 | A1 * | 12/2006 | Aube | A61M 5/1417 248/230.7 |
| 2022/0071047 | A1 * | 3/2022 | Jeong | H01Q 1/1228 |

FOREIGN PATENT DOCUMENTS

| | | |
|---|---|---|
| KR | 20-0443014 Y1 | 1/2009 |
| KR | 20-0452827 Y1 | 3/2011 |
| KR | 20-2013-0002278 U | 4/2013 |
| KR | 10-1320457 B1 | 10/2013 |
| KR | 10-1571473 B1 | 12/2015 |
| KR | 10-1635175 B1 | 7/2016 |

OTHER PUBLICATIONS

Written Opinion of the International Searching Authority dated Feb. 25, 2019 in connection with International Patent Application No. PCT/KR2018/013041, 5 pages.

Decision of Patent dated Apr. 27, 2022, in connection with Korean Application No. 10-2017-0148693, 4 pages.

* cited by examiner

DEVICE FOR FIXING COMMUNICATION EQUIPMENT

CROSS-REFERENCE TO RELATED APPLICATIONS

This application is a 371 of International Application No. PCT/KR2018/013041 filed on Oct. 30, 2018, which claims priority to Korean Patent Application No. 10-2017-0148693 filed on Nov. 9, 2017, the disclosures of which are herein incorporated by reference in their entirety.

BACKGROUND

1. Field

Various embodiments of the disclosure relate to a device for fixing communication equipment, the device fixing various pieces of communication equipments to a communication pole.

2. Description of Related Art

Various types of fixing devices for mounting various pieces of communication equipment to a communication pole have been developed. For example, a device for fixing communication equipment may be formed by steel pressing.

According to an embodiment of the disclosure, communication equipment and fixing brackets can be simply combined, so it is possible to improve convenience and safety in installation and prevent an installation error.

The parts of a device for fixing communication equipment are standardized and simplified, so it is possible to reduce the manufacturing cost and make assembly easy.

SUMMARY

A device for fixing communication equipment according to an embodiment of the disclosure may include: a plurality of fixing brackets configured to be coupled to a communication pole by coupling to each other around the outer surface of the communication pole; fastening grooves formed in the fixing brackets and coupled to connecting brackets; fixing grooves connected to the fastening grooves; and fixing assemblies disposed in the fixing grooves and including plate springs that protrude toward the fastening grooves or are inserted in the fixing grooves.

It is possible to slide and couple communication equipment to fixing brackets using fixing brackets according to an embodiment of the disclosure, so it is possible to improve convenience and safety in installation of the communication equipment and prevent an installation error.

A chain shape is achieved using a plurality of fixing brackets having the same shape and the fixing brackets are coupled to the outer surface of a communication pole, so the parts can be uniform, whereby manufacturing costs can be reduced and mass production becomes easy.

DETAILED DESCRIPTION

Figure 1:
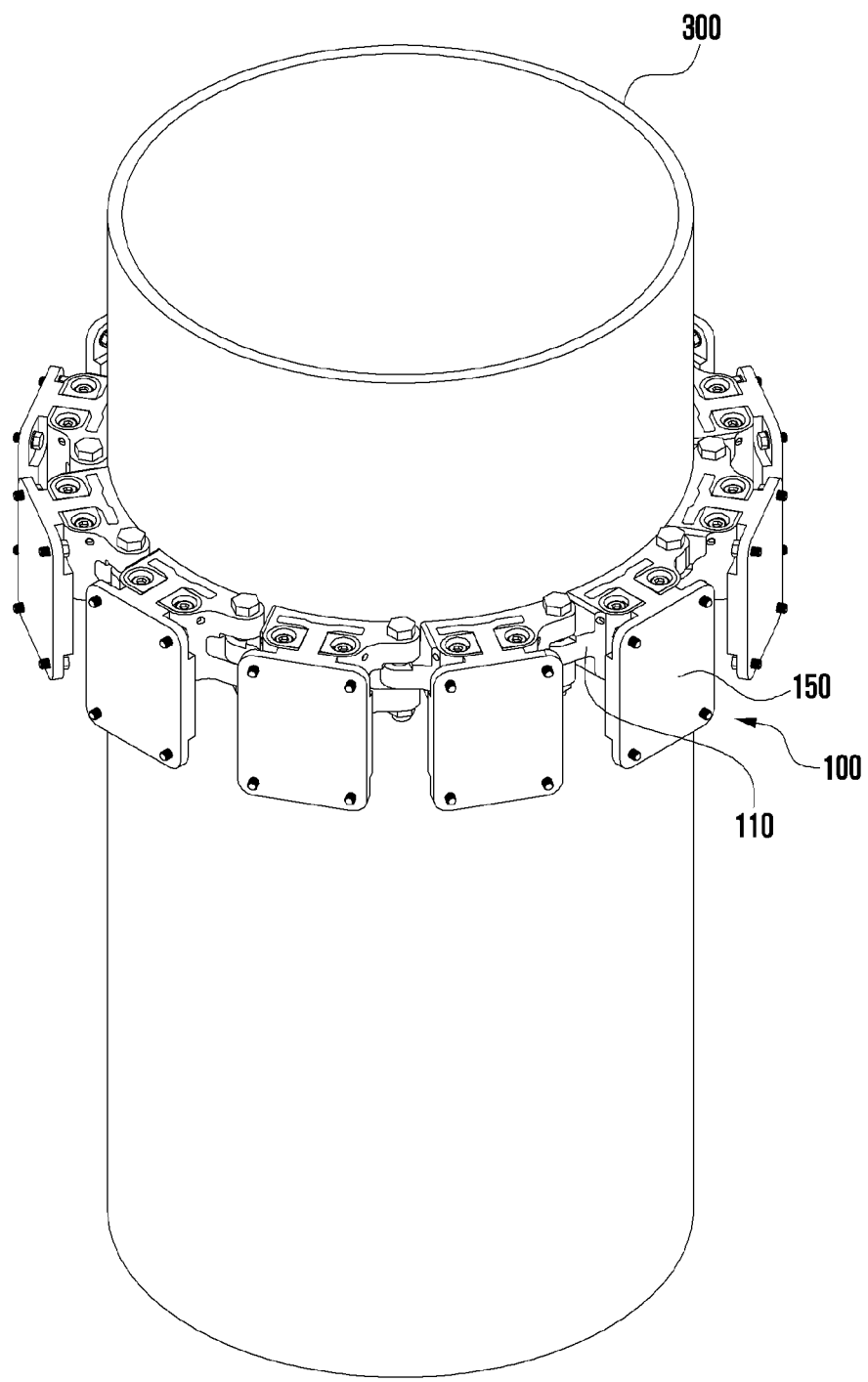
FIG. 1 is a view showing the state in which a device for fixing communication equipment according to an embodiment of the disclosure is coupled to a communication pole.

Hereinafter, various embodiments of the disclosure will be described with reference to the accompanying drawings. Embodiments and terms used therein are not intended to limit the technology disclosed herein to particular forms, and each embodiment should be construed to include various modifications, changes, equivalents, and/or alternatives of the corresponding embodiment. With regard to the description of the drawings, similar reference numerals may be used for similar elements. It is to be understood that a singular expression may plural expressions unless the relevant context clearly indicates otherwise. As used herein, such phrases as "A or B" and "at least one of A and/or B" may include all possible combinations of the items enumerated together. As used herein, such terms as "a first", "a second", "the first", and "the second" may modify corresponding elements regardless of their order or importance, may be used only to distinguish one element from any other element, and does not limit the corresponding elements. It is to be understood that if an element (e.g., a first element) is referred to as "(operatively or communicatively) coupled with," "coupled to," "connected with," or "connected to" another element (e.g., a second element), it means that the element may be coupled with the other element directly or via another element (e.g., a third element).

The expression "configured to" used in the disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., Central Processing Unit (CPU) or Application Processor (AP)) that can perform the corresponding operations by executing one or more software programs stored in a memory device.

FIG. 1 is a view showing the state in which a device for fixing communication equipment according to an embodiment of the disclosure is coupled to a communication pole.

A device 100 for fixing communication equipment according to an embodiment of the disclosure can be coupled to a communication pole 300 by coupling a plurality of fixing brackets 110 to each other while surrounding the outer surface of the communication pole 300. For example, the fixing brackets 110 may be coupled to each other in a chain shape. The fixing brackets 110 coupled in a chain shape can be coupled to the communication pole 300 while surrounding the outer surface of the communication pole 3000.

Figure 3:
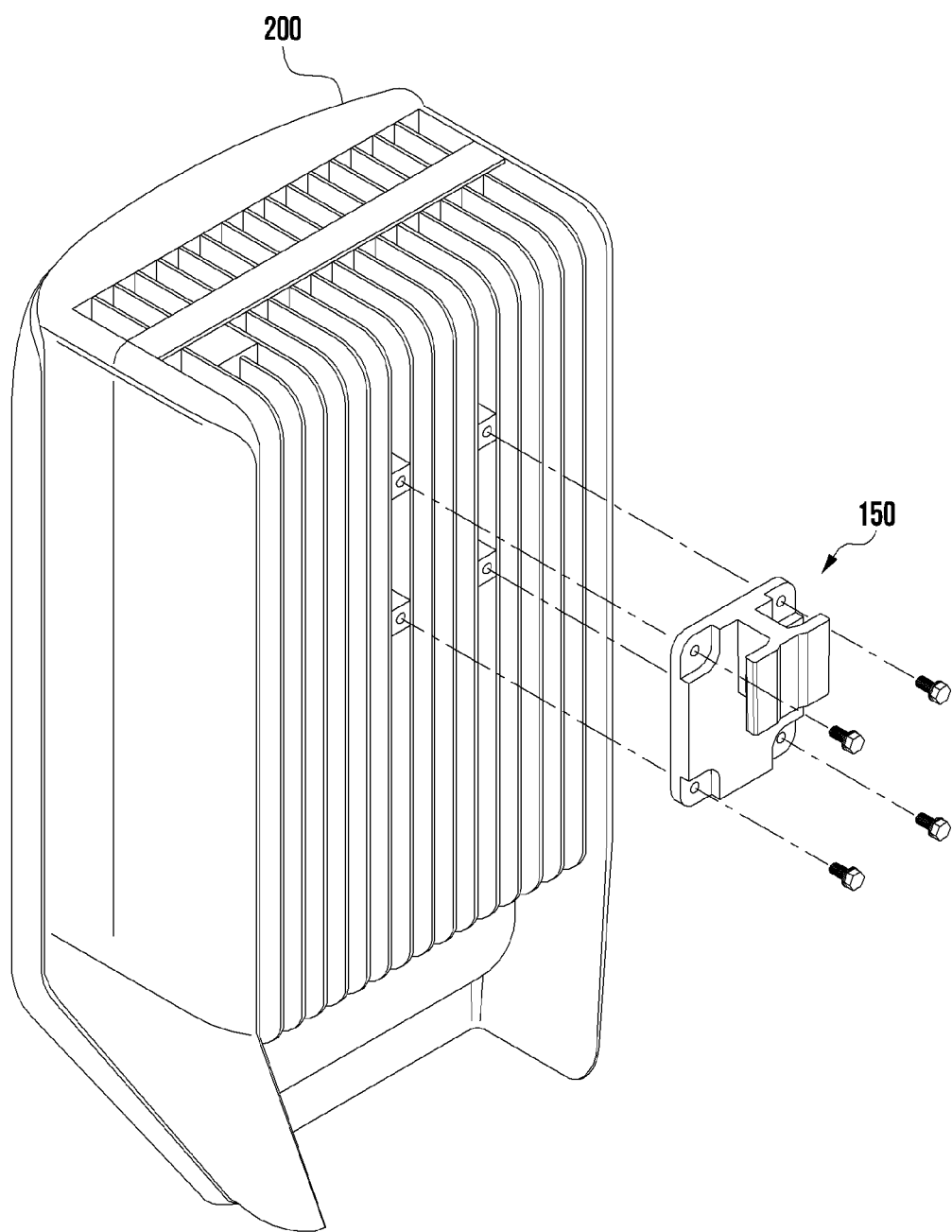
FIG. 3 is a view showing the state in which the connecting bracket is coupled to the communication equipment according to an embodiment of the disclosure.

The communication pole 300 may mean a pole that is used to install communication equipment (200, see FIG. 3). However, the communication pole is not limited thereto and may include all types as long as they have a rod shape and the fixing brackets 110 according to an embodiment of the disclosure can be coupled thereto.

The device 100 for fixing communication equipment according to an embodiment of the disclosure can couple the communication pole 300 and communication equipment (200, see FIG. 3) in correspondence to communication poles 300 having various diameters without a specific change in design by adjusting the number of the fixing brackets 110 that are connected to fit to the diameters of the communication pole 300.

A fastening groove (120, see FIG. 4) in which the connecting bracket 150 to be described below can be coupled may be formed at each of the fixing brackets 110. A surface of the connecting bracket 150 can be coupled to various types of communication equipment (200, see FIG. 3) and the other surface thereof can be coupled to the fastening groove (120, see FIG. 4) of the fixing bracket 110, whereby the communication equipment (200, see FIG. 3) can be coupled to the communication pole 300.

Figure 2A:
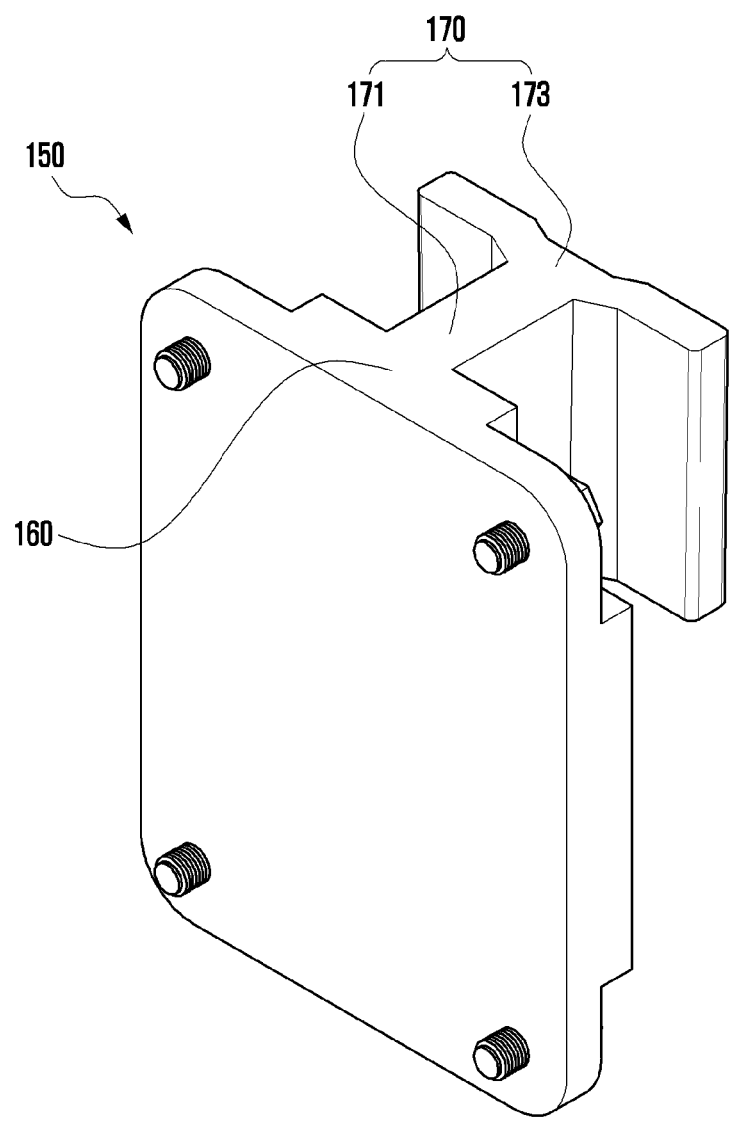
FIGS. 2A and 2B are views of a connecting bracket according to an embodiment of the disclosure.
Figure 2B:
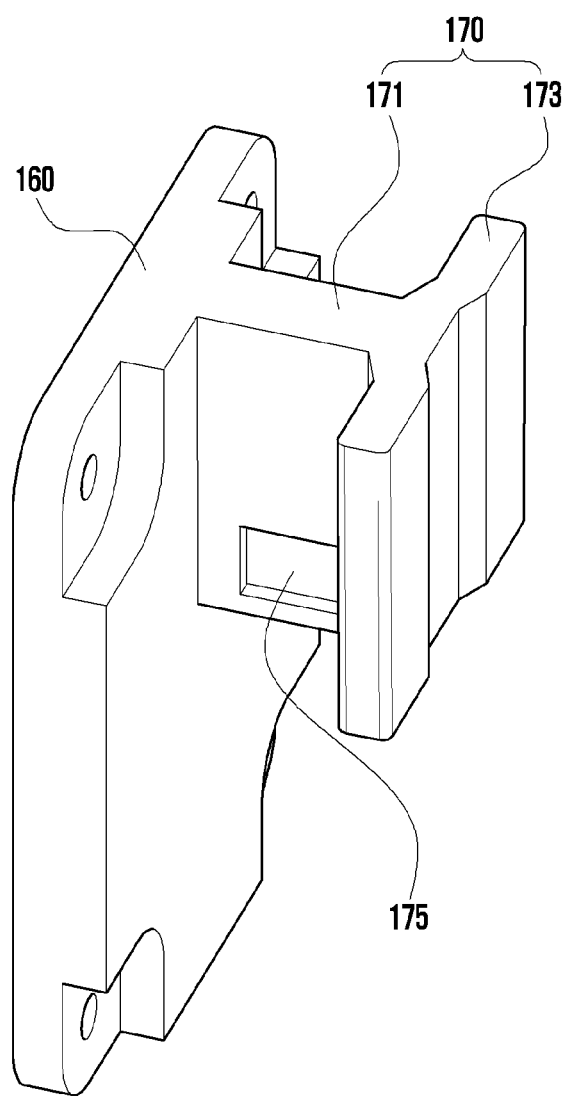

FIGS. 2A and 2B are views of a connecting bracket 150 according to an embodiment of the disclosure.

In the terms for describing the connecting bracket 150 according to an embodiment of the disclosure, a width direction may mean a left-right direction of a base 160 and a length direction may mean an up-down direction of the base 160 in the state shown in FIG. 2A.

Terms such as up-down and left-right are used, as described above, to help understand the connecting bracket 150 according to an embodiment of the disclosure, but these terms are relative terms rather than absolute references.

Referring to FIG. 2A, the connecting bracket 150 according to an embodiment of the disclosure, may be composed of a base 160 and a fastening protrusion 170. A surface of the base 160 can be coupled to the communication equipment (200, see FIG. 3) and the fastening protrusion 170 may be formed on the other surface of the base. The fastening protrusion 170 is inserted in the fastening groove (120, see FIG. 4) of the fixing bracket (110, see FIG. 4) to be described below, thereby being able to couple the connecting bracket 150 and the fixing bracket (110, see FIG. 4).

The fastening protrusion 170 may be composed of a first fastening protrusion 171 and a second fastening protrusion 173. The first fastening protrusion 171 may be formed in the length direction of the base 160 and may protrude perpendicularly from the other surface of the base 160. The second fastening protrusion 173 may extend in the width direction of the base 160 from the protruding end of the first fastening protrusion 171. That is, when seen from the top in FIG. 2A, the first fastening protrusion 171 and the second fastening protrusion 173 may be formed in a T-shape.

The fastening protrusion 170 can prevent the connecting bracket 150 from being separated from the fixing bracket (110, see FIG. 4) due to force that acts in the front-rear direction in the state shown in FIG. 2A.

FIG. 2B is a view showing the connecting bracket 150 according to an embodiment of the disclosure from another angle.

Referring to FIG. 2B, an insertion groove 175 may be formed on the width-directional surface of the first fastening protrusion 171. The insertion groove 175 may be formed on both width-directional surfaces of the first fastening protrusion 171. A plate spring 141 of a fixing assembly 140 to be described below is inserted and locked in the insertion grooves 175, whereby it is possible to prevent the connecting bracket 150 from being separated from the fixing bracket (110, see FIG. 4) due to force that acts in the up-down direction. A detailed coupling method will be described with reference to FIGS. 7A to 7D.

Figure 4:
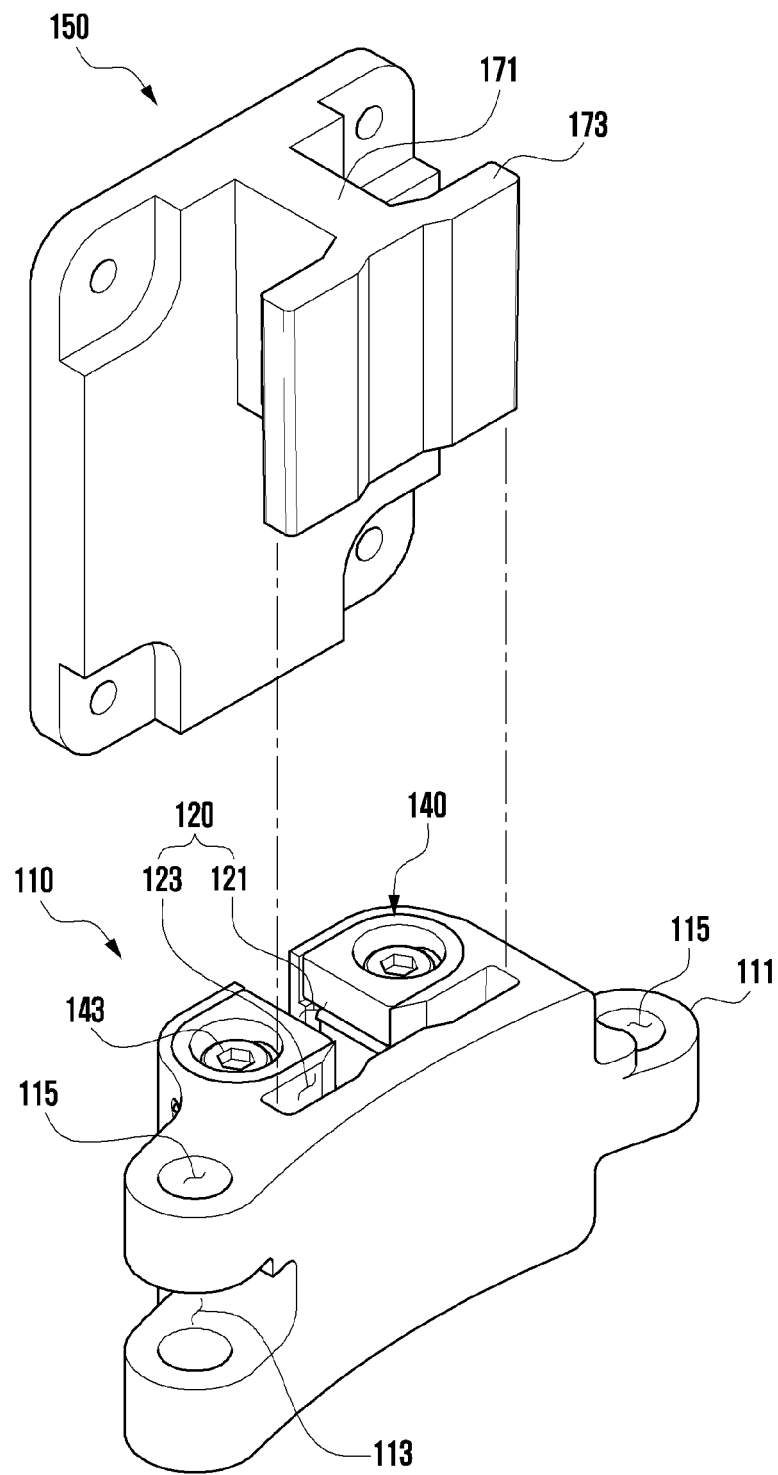
FIG. 4 is a view briefly showing a method of coupling a connecting bracket and a fixing bracket of the device for fixing communication equipment according to an embodiment of the disclosure.

FIG. 3 is a view showing the state in which the connecting bracket 150 according to an embodiment of the disclosure is coupled to communication equipment and FIG. 4 is a view briefly showing a method of coupling the connecting bracket 150 and the fixing bracket 110 of the device (100, see FIG. 1) for fixing communication equipment according to an embodiment of the disclosure.

Although the communication equipment 200 is bolted to a surface of the base (160, see FIG. 2) in FIG. 3, the disclosure is not limited thereto and various types such as fitting, latching, sliding may be used.

The communication equipment 200 and the connecting bracket 150 are coupled, as shown in FIG. 3, and then, the fastening protrusion 170 of the connecting bracket 150 is inserted into the fixing bracket 110, as shown in FIG. 4, whereby the connecting bracket 150 and the fixing bracket 110 can be coupled without an additional work process such as bolting.

The communication equipment 200 may be installed high from the ground for smooth transmission/reception of radio waves and may weight under 1 kg, if small, and over 10 kg, if large, depending on the performance and function, that is, the size and weight may be varied. When the communication equipment 200 is heavy, and is carried high and installed on a communication pole (300, see FIG. 1) through an additional assembly process such as bolting, it may be difficult to secure stability in the installation process and to secure reliability in fixation of the communication equipment 200.

Therefore, according to the device (100, see FIG. 1) for fixing communication equipment according to an embodiment of the disclosure, it is possible to secure stability in the installation process and to secure reliability in fixation of the communication equipment 200 by additionally performing only processes of coupling the fixing brackets 110, which can be easily carried, to a communication pole (300, see FIG. 1), coupling the connecting brackets 150 to the communication equipment 200, and then moving the communication equipment 200 a high position from the ground and inserting the communication equipment 200 into the fixing brackets.

Figure 5:
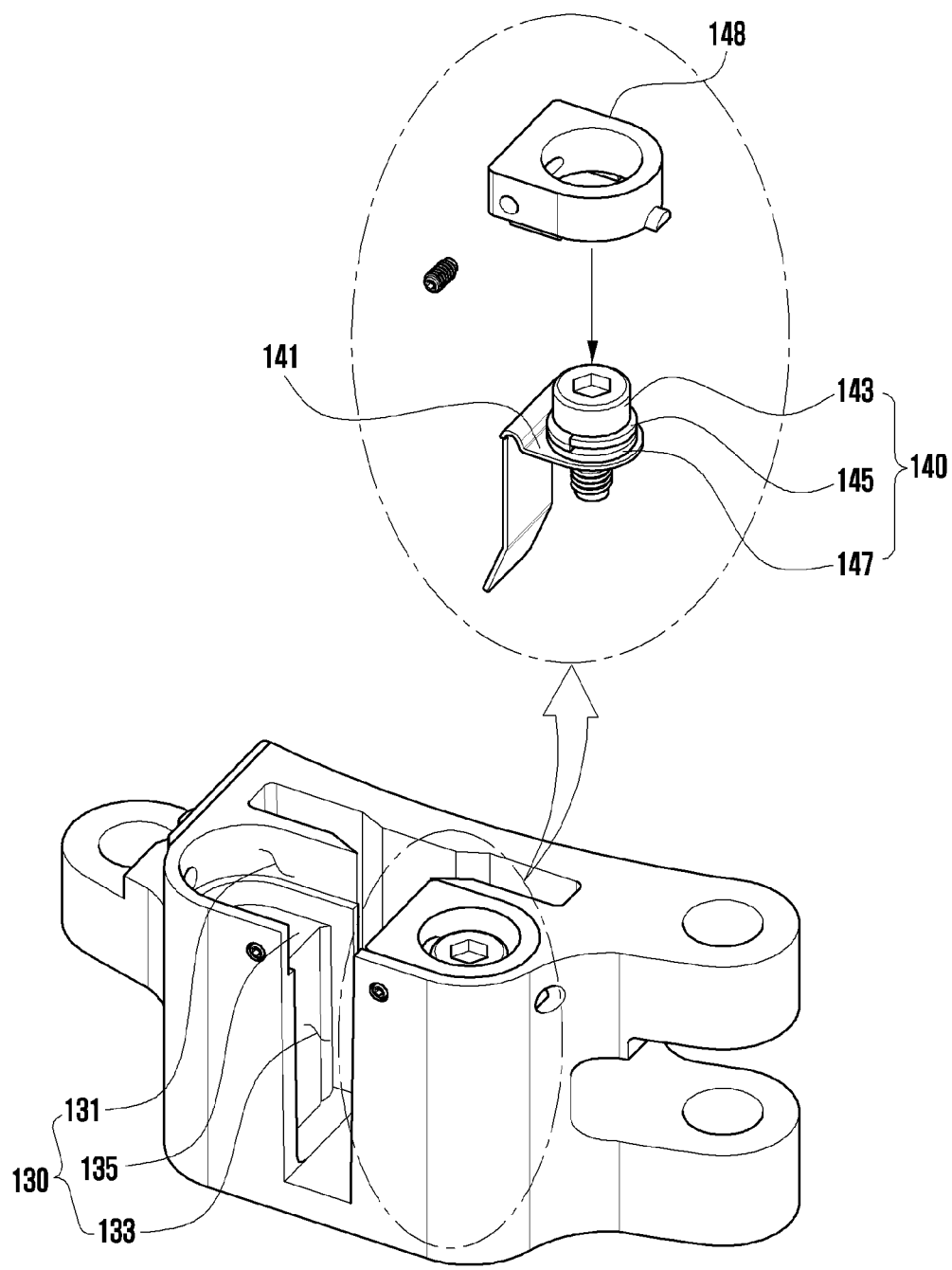
FIG. 5 is a perspective view of a fixing bracket and a fixing assembly according to an embodiment of the disclosure.

FIG. 5 is a perspective view of a fixing bracket 110 and a fixing assembly 140 according to an embodiment of the disclosure.

In terms for describing the fixing bracket 110 according to an embodiment of the disclosure, a surface may mean the front surface and the other surface may mean the rear surface in the state shown in FIG. 5. A width direction of the fixing bracket 110 may mean a left-right direction and a length direction thereof may mean an up-down direction in the state shown in FIG. 5.

Terms such as up-down, left-right, a front surface, or a rear surface is used, as described above, to help understand the fixing bracket 110 according to an embodiment of the disclosure, but these terms are relative terms rather than absolute references.

The fixing bracket 110 according to an embodiment of the disclosure may have, in a broad meaning, a fastening groove 120, a fixing groove 130, and a fixing assembly 140.

The fastening groove 120, which is a part in which the fastening protrusion (170, see FIG. 2A) of the connecting bracket (150, see FIG. 2A) is inserted, may be formed to correspond to the shape of the fastening protrusion (170, see FIG. 2A) of the connecting bracket (150, see FIG. 2A) and may include a first fastening groove 121 and a second fastening groove 123.

The first fastening groove 121 may be recessed from a surface toward the other surface and may be formed to correspond to the shape of the first fastening protrusion (171, see FIG. 2A) of the connecting bracket (150, see FIG. 2A). The first fastening groove 121 may be recessed from a surface toward the other surface without passing through the fixing bracket 110. The second fastening groove 123 may extend in the width direction of the fixing bracket 110 at the end of the other surface of the first fastening groove 121 and may be formed to correspond to the shape of the second fastening protrusion (173, see FIG. 2A) of the connecting bracket (150, see FIG. 2A). The second fastening groove 123 may also extend in the width direction of the fixing bracket 110 without passing through the fixing bracket 110 in the width direction. That is, the fastening groove may be formed in a T-shape when seen from the top in the state shown in FIG. 2.

The fastening groove may not pass through the fixing bracket 110 in the up-down direction. Accordingly, it is possible to prevent the connecting bracket (150, see FIG. 2A) from being separated through the fixing bracket 110 due to the gravity when the connecting bracket (150, see FIG. 2A) is inserted in the fastening groove 120 of the fixing bracket 110.

The fixing groove 130 may be formed by connecting to the first fastening groove 121 and may be recessed in the width direction of the fixing bracket 110. Referring to FIG. 5, the fixing groove may be formed between a surface of the fixing bracket 110 and the second fastening groove 123 when seen from the top.

The fixing groove 130 may include a first fixing groove 131 and a second fixing groove 133. The first fixing groove 131 may be biased upward in the length direction of the fixing bracket 110 and may be open to the top of the fixing bracket 110. The second fixing groove 133 may be connected to the first fixing groove 131 under the first fixing groove 131 and may be recessed less than the first fixing groove 131 in the width direction of the fixing bracket 110 without passing through the bottom of the fixing bracket 110.

Since the first fixing groove 131 and the second fixing groove 133 are recessed to different depths, a locking step 135 may be formed at the first fixing groove 131. A threaded hole may be formed in the locking step 135 so that a bolt 143 of the fixing assembly 140 to be described below can be fastened.

In the width direction of the fixing bracket 110, a chain protrusion 111 may be formed at a side and a chain groove 113 may be formed at the other side. The chain protrusion 111 formed at any one fixing bracket 110 of a plurality of fixing brackets 110 can be inserted into the chain groove 113 of another fixing bracket 110.

Chain holes 115 may be formed through the chain protrusion 111 and the chain groove 113 of the fixing bracket 110. When a plurality of fixing brackets 110 is coupled to each other by inserting the chain protrusions 111 in the chain grooves 113, the chain holes 115 formed at the chain grooves 113 and the chain protrusions 111 can be respectively aligned with each other. By inserting fasteners such as bolts into the aligned chain holes 115, a plurality of fixing brackets 110 can be connected in a chain shape, as shown in FIG. 1A.

Figure 6:
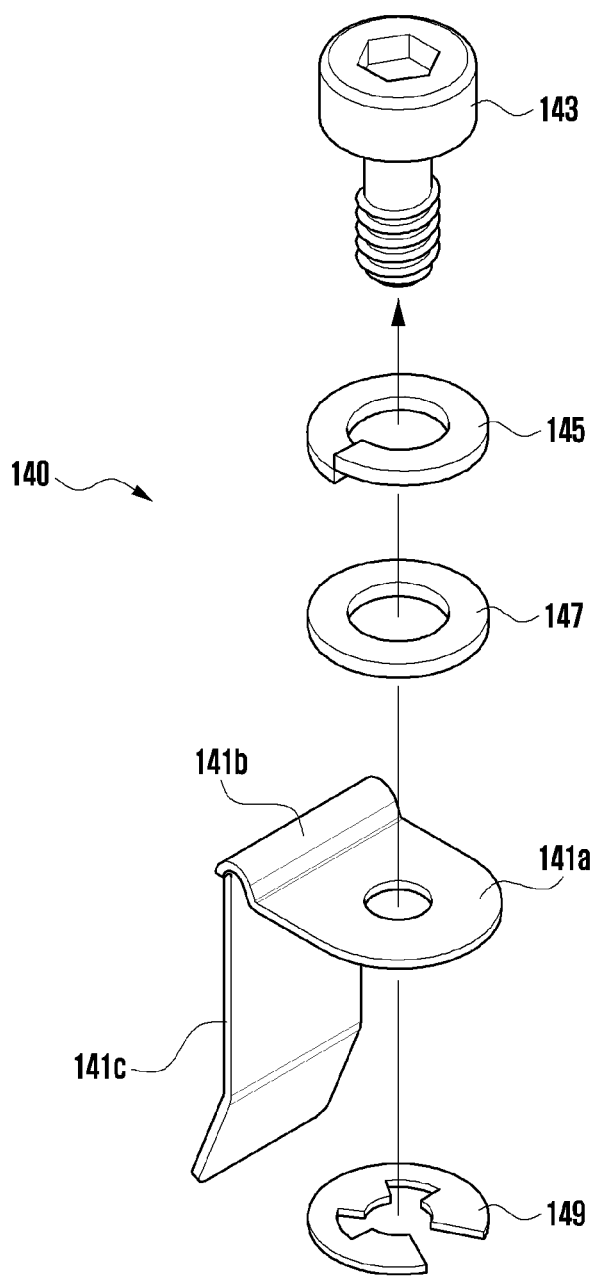
FIG. 6 is a view showing the fixing assembly according to an embodiment of the disclosure.

FIG. 6 is an exploded perspective view of the fixing assembly 140 according to an embodiment of the disclosure.

The fixing assembly 140, in a broad meaning, may include a bolt 143, a spring washer 145, and a plate spring 141.

The bolt 143 may have a thread spaced a predetermined distance apart from the bolt head. This may secure a space to that the spring washer 145 and the plate spring 141 that are fitted on the bolt 143 can freely move in a predetermined range. Although a bolt 143 that is tightened by a hex wrench is shown in the figure, a bolt 143 that is tightened by a flathead screwdriver or a crosshead screwdriver that is generally used may be used.

The spring washer 145 is fitted on the bolt 143, thereby being able to provide elasticity between the bolt head and the part that is fitted next on the bolt 143 and to fix a part such as the plate spring 141 in close contact with the locking step 135 when the bolt 143 is tightened.

The plate spring 141 protrudes toward the first fastening hole of the fixing bracket 110 and is inserted in the insertion groove 175 of the connecting bracket (150, see FIG. 2A), thereby being able to prevent the connecting bracket (150, see FIG. 2A) from being separated from the fixing bracket 110.

In the detailed shape of the plate spring 141, the plate spring 141 may have an inserting portion 141 having a hole to be able to be fitted on the bolt 143, a bending portion 141b extending from the inserting portion 141a and having a protrusion with a predetermined radius, and a fixing portion 141c extending from the bending portion 141b to protrude toward the first fastening groove 121 or to be inserted in the second fixing groove 133.

The inserting portion 141a of the plate spring 141 is formed to correspond to the position of the first fixing groove 131 and can be seated on the locking step 135 formed at the joint between the first fixing groove 131 and the second fixing groove 133. The plate spring 141 may bend such that the fixing portion 141c can be seated in the second fixing groove 133. That is, the entire shape may be an L-shape.

The bending portion 141b protruding with a predetermined radius may be formed between the inserting portion 141a and the fixing portion 141c. The radius of the bending portion 141b may be a minimum radius that can be defined in accordance with the material of the plate spring 141. Since the bending portion 141b is formed, when force is applied such that the plate spring 141 is unfolded, stress exerted in the bending portion 141b can be distributed. It is possible to resist a large force, as compared with when the bending portion is simply bent with the predetermined radius.

An end of the fixing portion 141c may protrude toward the first fastening hole when the inserting portion 141a is in close contact with the locking step 135. The degree of protrusion may depend on the depth of the insertion groove 175 of the connecting bracket (150, see FIG. 2A).

The fixing assembly 140 may further include a flat washer 147 and a snap ring 149. The flat washer 147 may be disposed between the spring washer 145 and the inserting portion 141a of the plate spring 141 and can uniformly transmit the elasticity provided from the spring washer 145 to the inserting portion 141a.

The snap ring 149, which is a part that is fitted last on the bolt 143, can make the fixing assembly 140 maintain the assembled state in one module type without disassembling.

After the fixing assembly 140 is inserted in the fixing groove 130, a cover block 148 formed to correspond to the shape of the first fixing groove 131 can be inserted in the first fixing groove 131 and coupled to the fixing bracket 110. The cover block 148 can be fixed to the fixing bracket 110 by a fastener such as a bolt.

FIGS. 7A to 7D are views showing the sequence of coupling the connecting bracket 150 to the fixing bracket 110 according to an embodiment of the disclosure.

Figure 7A:
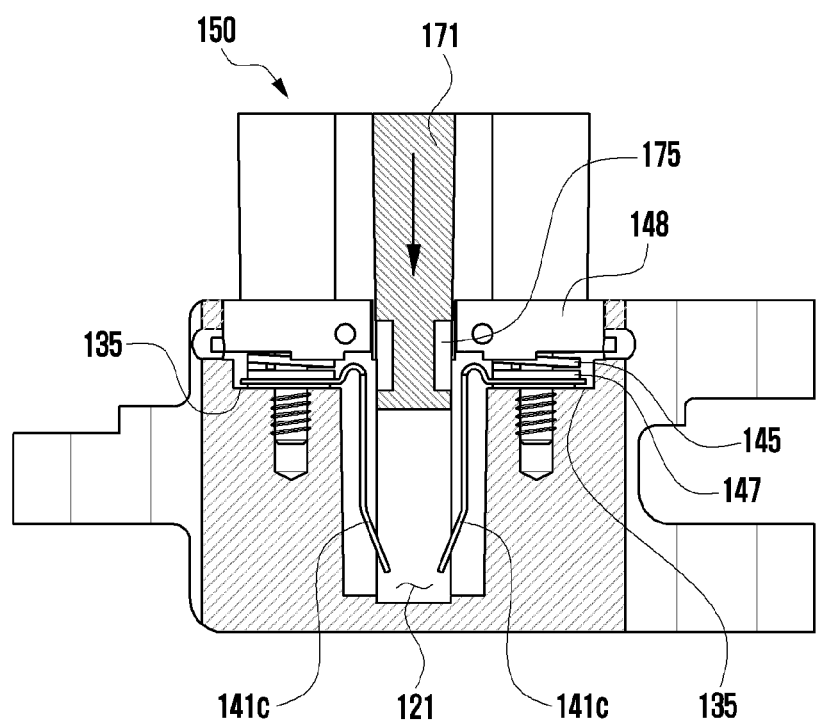
FIGS. 7A to 7D are views showing the sequence of coupling the connecting bracket to the fixing bracket according to an embodiment of the disclosure.
Figure 7B:
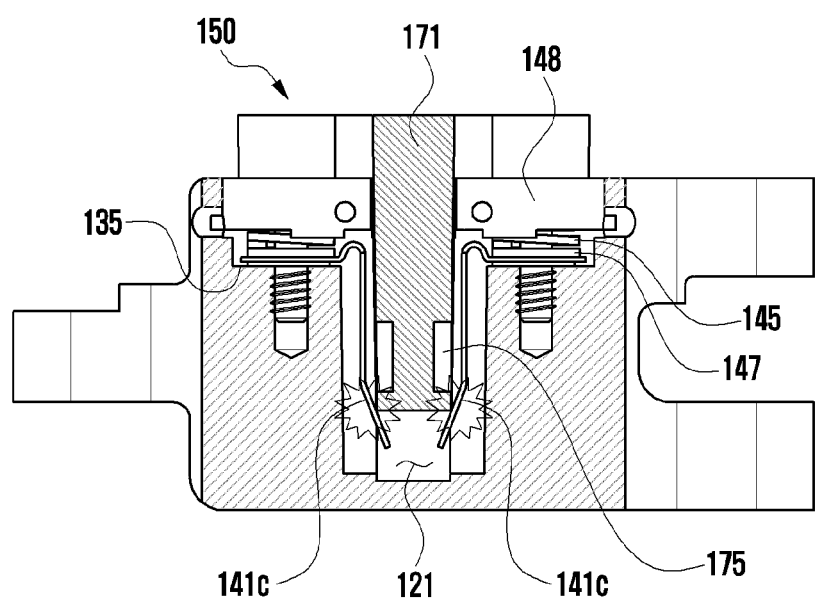
Figure 7C:
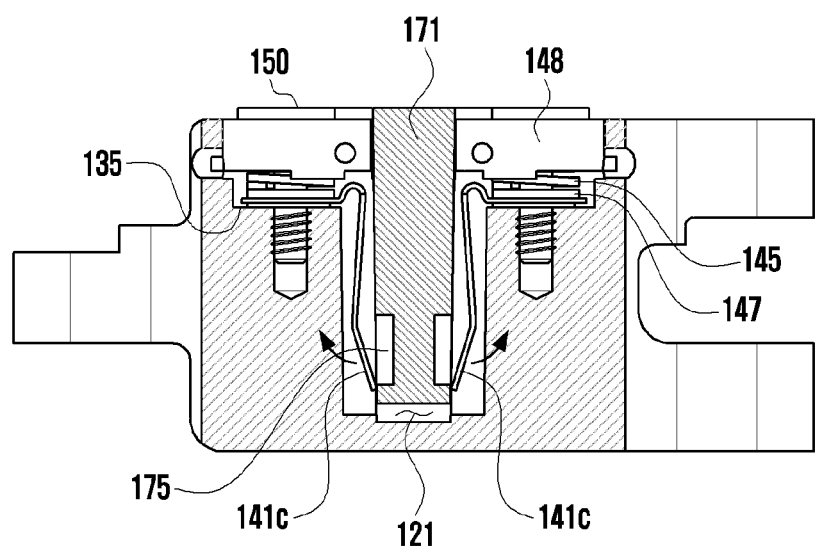
Figure 7D:
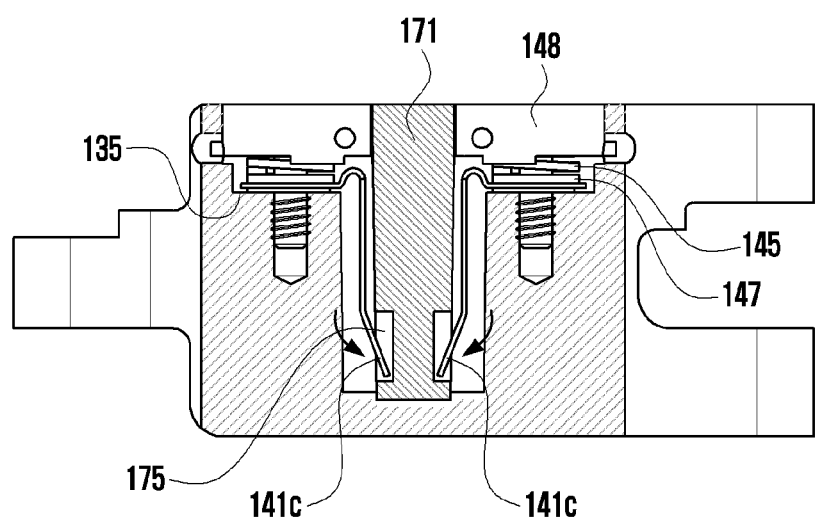

When the first fastening protrusion 171 of the connecting bracket 150 starts to be inserted into the first fastening groove 121 of the fixing bracket 110, as shown in FIG. 7A, the first fastening protrusion 171 can come in contact with the fixing portions 141c of the plate springs 141, as shown in FIG. 7B. Since the plate springs 141 elastically deform, when the first fastening protrusion 171 is inserted further, the fixing portions 141c of the plate springs 141 can be temporarily pushed into the second fixing groove 133. Thereafter, when the first fastening protrusion 171 is fully inserted in the first fastening groove 121, the end of the fixing portions 141c are inserted in the insertion grooves 175, so coupling of the connecting bracket 150 and the fixing bracket 110 can be completed.

In this state, even if the connecting bracket 150 is intended to be moved back upward, the connecting bracket 150 is difficult to separate because the fixing portions 141c are inserted and locked in the insertion grooves 175. In this process, even if larger force is applied to separate the connecting bracket 150, as described above, the bending portions 141b of the plate spring 141 having a predetermined radius distribute stress, so deformation is prevented and separation of the connecting bracket 150 can be prevented.

FIGS. 8A to 8D are views showing the sequence of separating the connecting bracket 150 from the fixing bracket 110 according to an embodiment of the disclosure.

Depending on cases, the communication equipment (200, see FIG. 3) can be separated from the fixing brackets 110. It may be required to separate the communication equipment (200, see FIG. 3) to replace or repair the communication equipment, and since this work is performed at a high position, it may be advantageous to be able separate the communication equipment without large force or a complicated disassembly process.

When the bolt 143 of the fixing assembly 140 according to an embodiment of the disclosure is loosened, the fixing portion 141c of the plate spring 141 can be easily pulled out of the insertion groove 175, so the connecting bracket 150 can be easily separated from the fixing bracket 110.

Figure 8A:
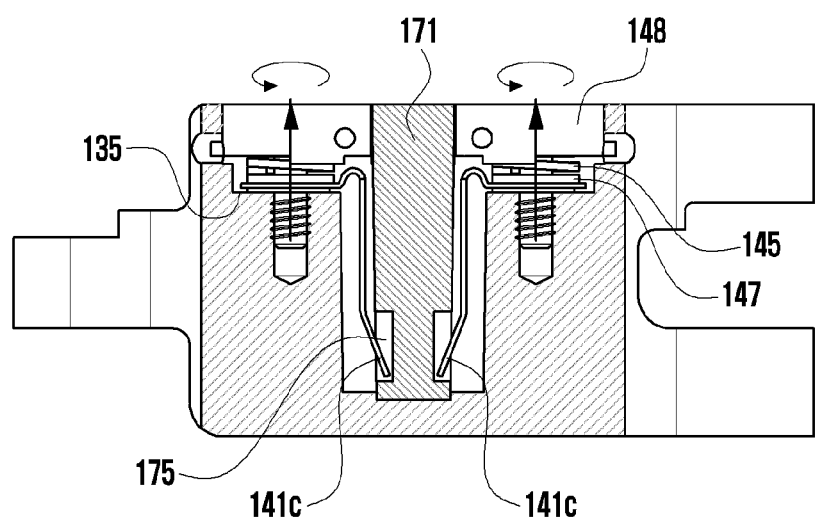
FIGS. 8A to 8D are views showing the sequence of separating the connecting bracket from the fixing bracket according to an embodiment of the disclosure.
Figure 8B:
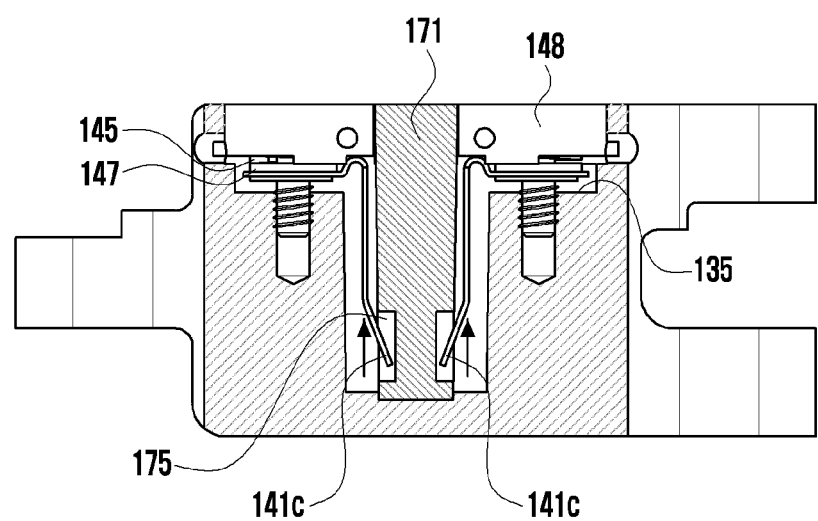
Figure 8C:
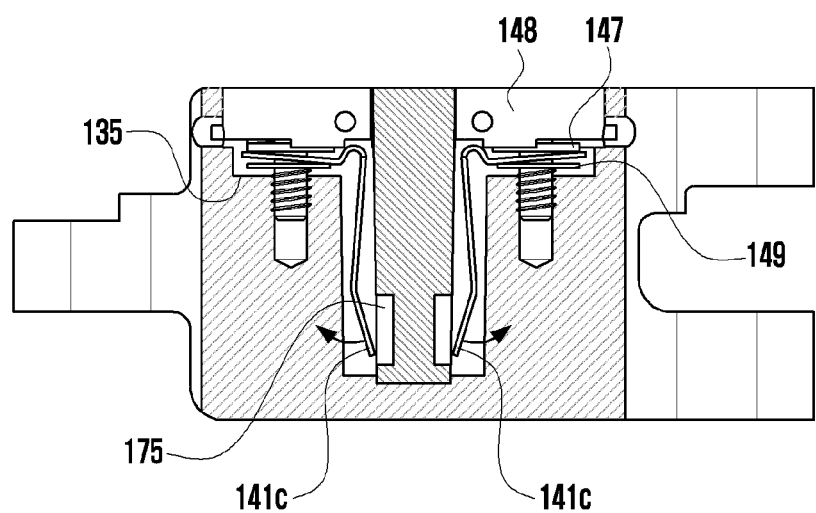
Figure 8D:
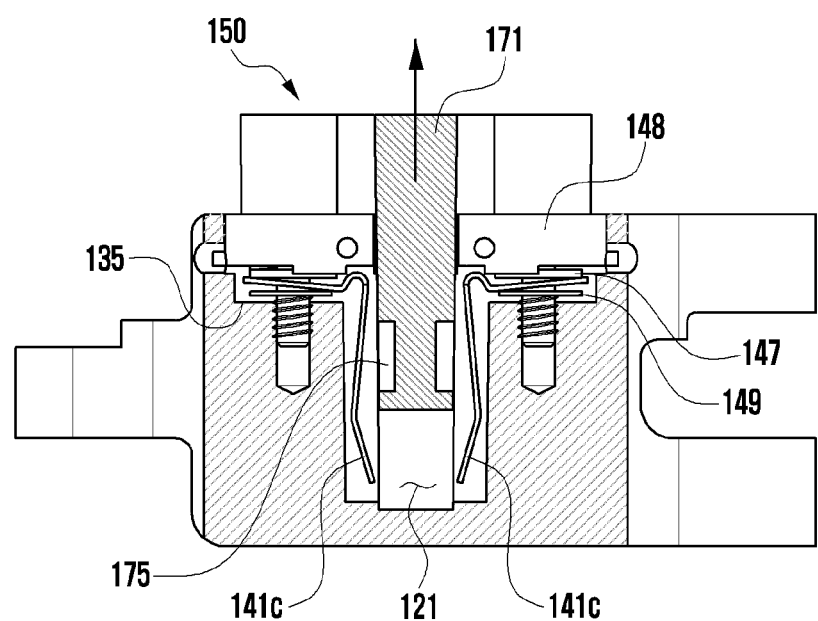

As shown in FIG. 8A, when the bolts 143 are loosened, the inserting portions 141a of the plate spring 141 can come off the locking steps 135. In this case, the center of gravity is biased by the fixing portions 141c of the plate spring 141, so the fixing portions 141c are naturally moved into the second fixing groove 133. As the bolts 143 are loosened further, the snap rings 149 pull the plate springs 141, the flat washers 147, and the spring washers 145 up to the cover blocks 148, portions of the inserting portions (141a, see FIG. 6) of the plate springs 141 and the bending portions (141b, see FIG. 6) come in contact with the bottoms of the cover blocks, and the fixing portions 141c keep inserted in the second fixing groove 133. In this state, the connecting bracket 150 can be separated from the fixing bracket 110 together with the communication equipment (200, see FIG. 3).

Figure 9:
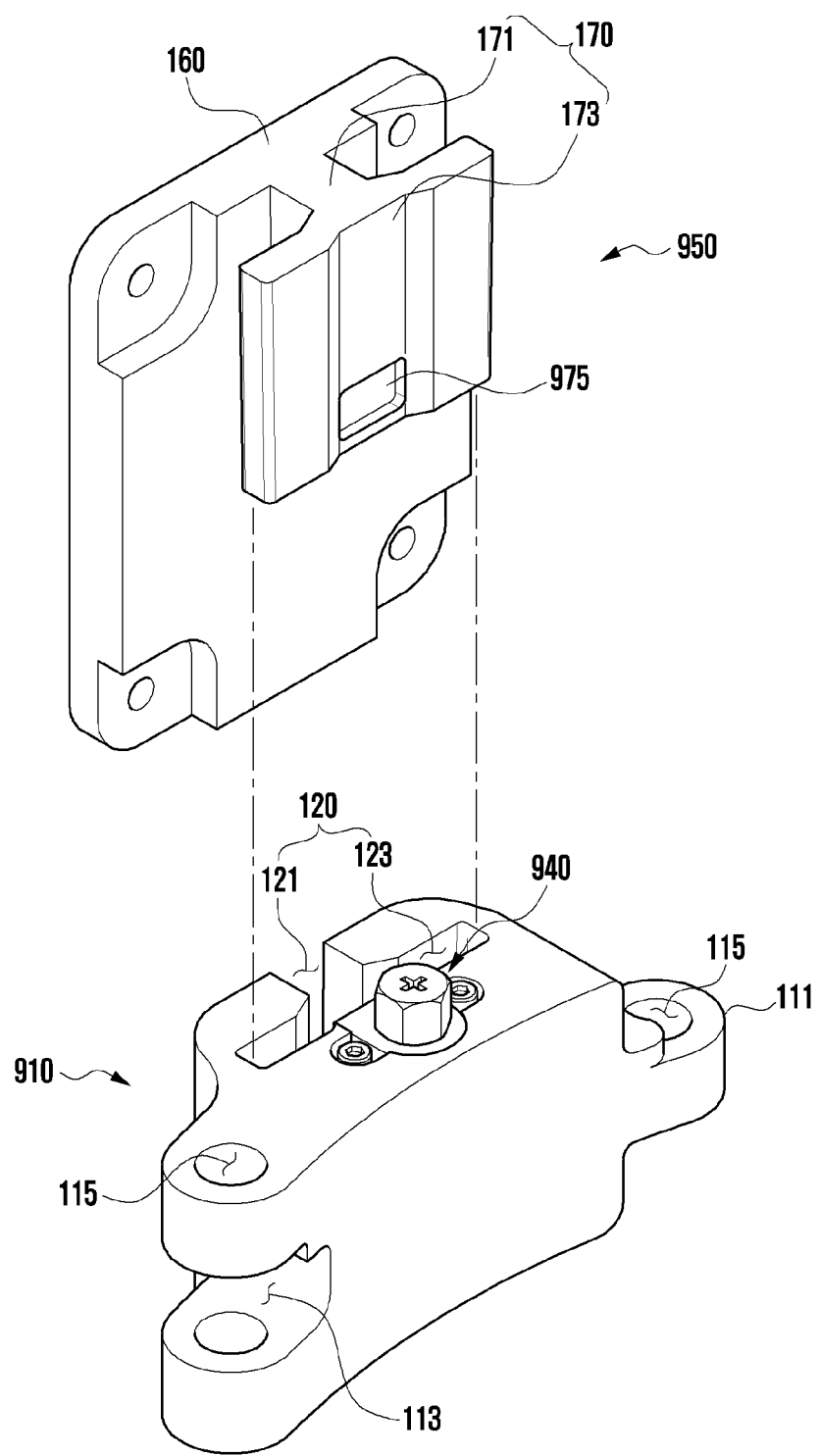
FIG. 9 is a view briefly showing a method of coupling a connecting bracket and a fixing bracket of the device for fixing communication equipment according to another embodiment of the disclosure.

FIG. 9 is a view briefly showing a method of coupling a connecting bracket 950 and a fixing bracket 910 of the device for fixing communication equipment according to another embodiment of the disclosure.

Similar to that shown in FIG. 3, the communication equipment 200 and the connecting bracket 950 are coupled, and then, the fastening protrusion 170 of the connecting bracket 950 is inserted into the fixing bracket 910, whereby the connecting bracket 950 and the fixing bracket 910 can be coupled without an additional work process such as bolting. In comparison to the embodiment of FIG. 4, the positions of the fixing grooves 930 may be changed and the number of the fixing assemblies 940 may be reduced in the embodiment of FIG. 9.

Figure 10:
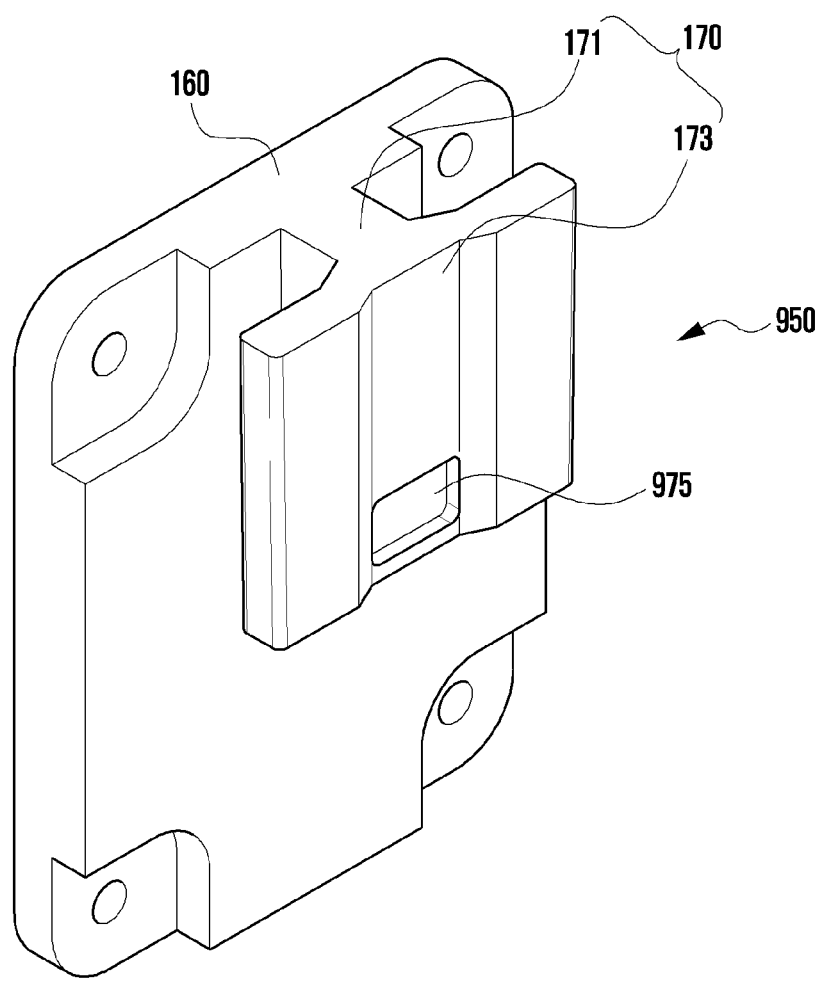
FIG. 10 is a view of a connecting bracket according to another embodiment of the disclosure.

FIG. 10 is a view of the connecting bracket 950 according to another embodiment of the disclosure.

In the description of the connecting bracket 950 according to another embodiment of the disclosure, the same components are given the same reference numerals as those in FIGS. 2A and 2B, and they are not described and differences are mainly described.

Referring to FIG. 10, an insertion groove 175 may be formed on the surface of the second fastening protrusion 171 and may be recessed on a surface that is opposite the surface connected to the first fastening protrusion. A plate spring 941 of a fixing assembly 940 to be described below is inserted and locked in the insertion grooves 175, whereby it is possible to prevent the connecting bracket 950 from being separated from the fixing bracket (910, see FIG. 9) due to force that acts in the up-down direction. A detailed coupling method will be described with reference to FIGS. 13A to 13D.

Figure 11:
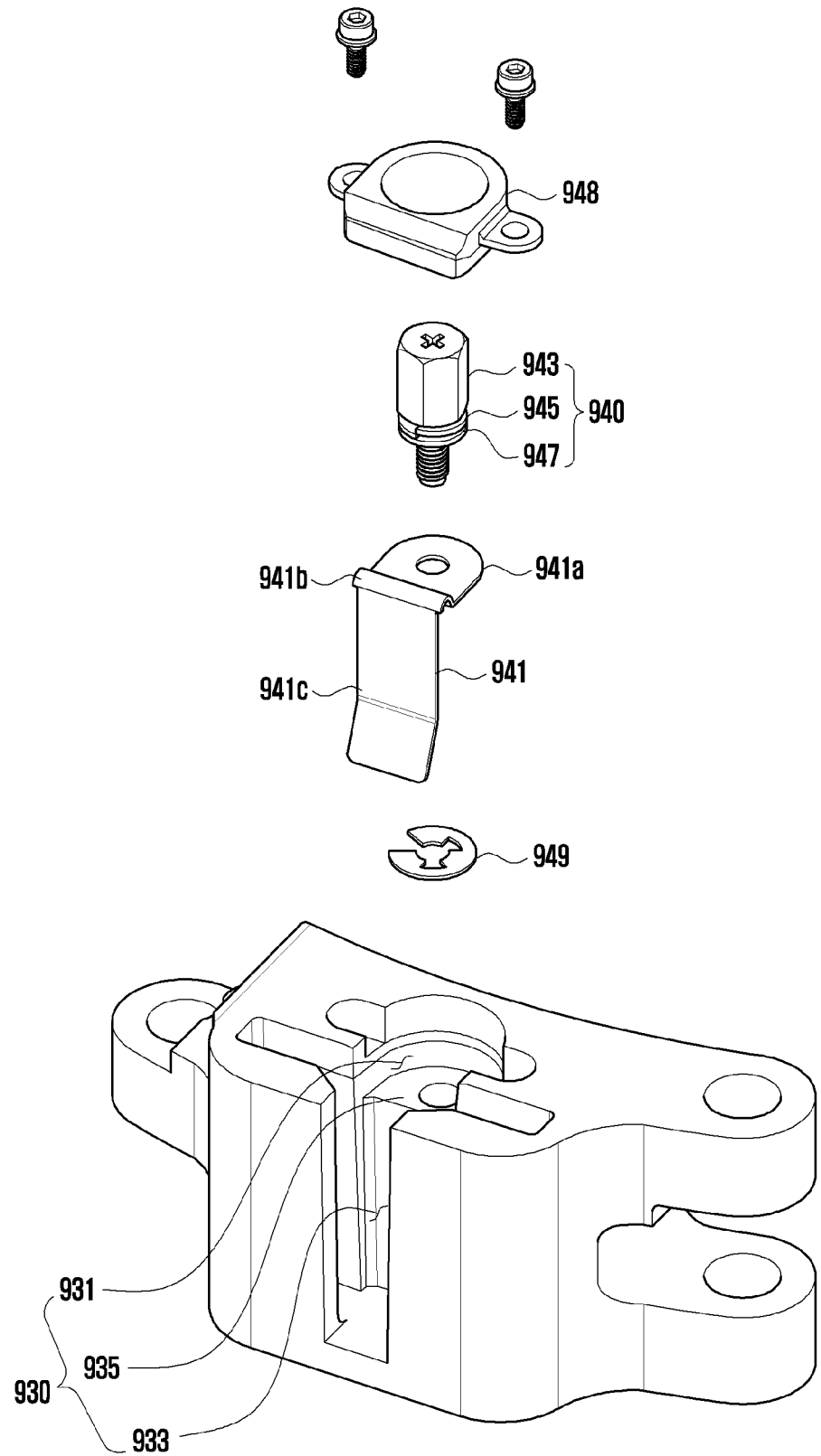
FIG. 11 is a perspective view of a fixing bracket and a fixing assembly according to another embodiment of the disclosure.

FIG. 11 is a perspective view of the fixing bracket 910 and the fixing assembly 940 according to an embodiment of the disclosure.

In the description of the fixing bracket 910 and the fixing assembly 940 according to another embodiment of the disclosure, the same components are given the same reference numerals as in FIG. 5 and are not described, and differences are mainly described.

The fixing groove 930 may be connected to the second fastening groove 123 and may be recessed toward the other surface of the fixing bracket 910. Referring to FIG. 11, when seen from the top, the first fastening groove 123 of the fixing bracket 910 extends and is recessed toward the other surface of the fixing bracket 910.

The fixing groove 930 may include a first fixing groove 931 and a second fixing groove 933. The first fixing groove 931 may be biased upward in the length direction of the fixing bracket 910 and may be open to the top of the fixing bracket 910. The second fixing groove 933 may be connected to the first fixing groove 931 under the first fixing groove 931 and may be recessed less than the first fixing groove 131 toward the other surface of the fixing bracket 910 without passing through the bottom of the fixing bracket 910.

Since the first fixing groove 931 and the second fixing groove 933 are recessed to different depths, a locking step 935 may be formed at the first fixing groove 931. A threaded hole may be formed in the locking step 935 so that a bolt 943 of the fixing assembly 940 to be described below can be fastened.

Figure 12:
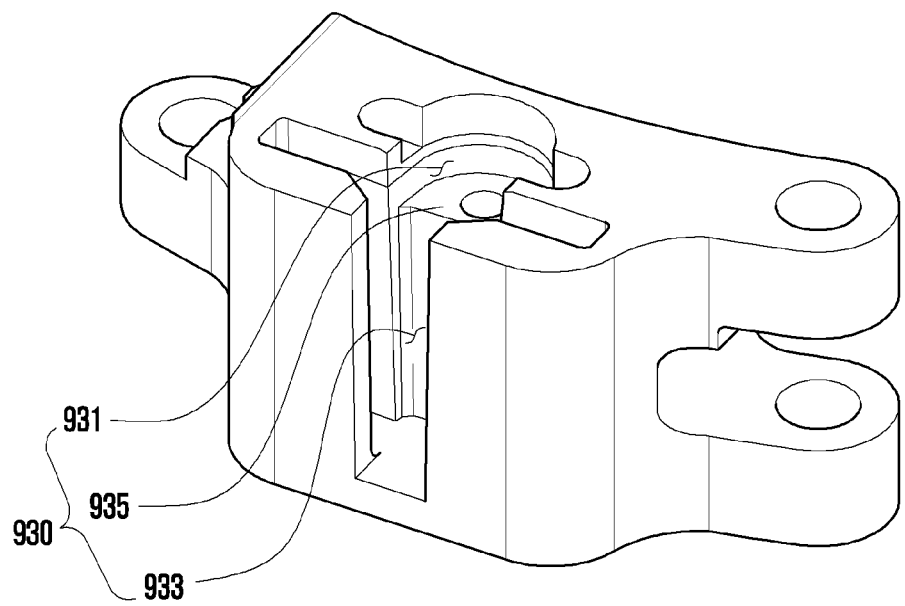
FIG. 12 is a view showing the fixing assembly according to another embodiment of the disclosure.

FIG. 12 is an exploded perspective view of the fixing assembly 940 according to another embodiment of the disclosure.

The fixing assembly 940, in a broad meaning, may include a bolt 943, a spring washer 945, and a plate spring 941.

The bolt 943 may have a thread spaced a predetermined distance apart from the bolt head. This may be for securing a space to that the spring washer 945 and the plate spring 941 that are fitted on the bolt 943 can freely move in a predetermined range. Although a bolt 943 that is tightened by a crosshead screwdriver is shown in the figure, a bolt 943 that is tightened by a flathead screwdriver or a hex wrench that is generally used may be used.

The spring washer 945 is fitted on the bolt 943, thereby being able to provide elasticity between the bolt head and the part that is fitted next on the bolt 943 and to fix a part such as the plate spring 941 in close contact with the locking step (935, see FIG. 11) when the bolt 943 is tightened.

The plate spring 941 protrudes toward the second fastening hole (123, see FIG. 9) of the fixing bracket (910, see FIG. 9) and is inserted in the insertion groove (975, see FIG. 10) of the connecting bracket (950, see FIG. 10), thereby being able to prevent the connecting bracket (950, see FIG. 10) from being separated from the fixing bracket (910, see FIG. 9).

In the detailed shape of the plate spring 941, the plate spring 941 may have an inserting portion 941a having a hole to be able to be fitted on the bolt 943, a bending portion 941b extending from the inserting portion 941a and having a protrusion with a predetermined radius, and a fixing portion 941c extending from the bending portion 941b to protrude toward the second fastening groove (123, see FIG. 9) or to be inserted in the second fixing groove (933, see FIG. 11).

The inserting portion 941a of the plate spring 941 is formed to correspond to the position of the first fixing groove 931 and can be seated on the locking step 935 formed at the joint between the first fixing groove 931 and the second fixing groove 933. The plate spring 941 may bend such that the fixing portion 941c can be seated in the second fixing groove 933. That is, the entire shape may be an L-shape.

The bending portion 941b protruding with a predetermined radius may be formed between the inserting portion 941a and the fixing portion 941c. The radius of the bending portion 941b may be a minimum radius that can be defined in accordance with the material of the plate spring 941. Since the bending portion 941b is formed, when force is applied such that the plate spring 941 is unfolded, stress exerted in the bending portion 941b can be distributed. It is possible to resist a large force, as compared with when the bending portion is simply bent with the predetermined radius.

An end of the fixing portion 941c may protrude toward the second fastening hole (123, see FIG. 9) when the inserting portion 941a is in close contact with the locking step 935. The degree of protrusion may depend on the depth if the insertion groove 975 of the connecting bracket (950, see FIG. 10).

The fixing assembly 940 may further include a flat washer 947 and a snap ring 949. The flat washer 947 may be disposed between the spring washer 945 and the inserting portion 941a of the plate spring 941 and can uniformly transmit the elasticity provided from the spring washer 945 to the inserting portion 941a.

The snap ring 949, which is a part that is fitted last on the bolt 943, can make the fixing assembly 940 maintain the assembled state in one module type without disassembling.

After the fixing assembly 940 is inserted in the fixing groove 930, a cover block 948 formed to correspond to the shape of the first fixing groove 931 can be inserted in the first fixing groove 931 and coupled to the fixing bracket (910, see FIG. 9). The cover block 948 can be fixed to the fixing bracket (910, see FIG. 9) by a fastener such as a bolt.

FIGS. 13A to 13D are views showing the sequence of coupling the connecting bracket 950 to the fixing bracket 910 according to another embodiment of the disclosure.

Figure 13:
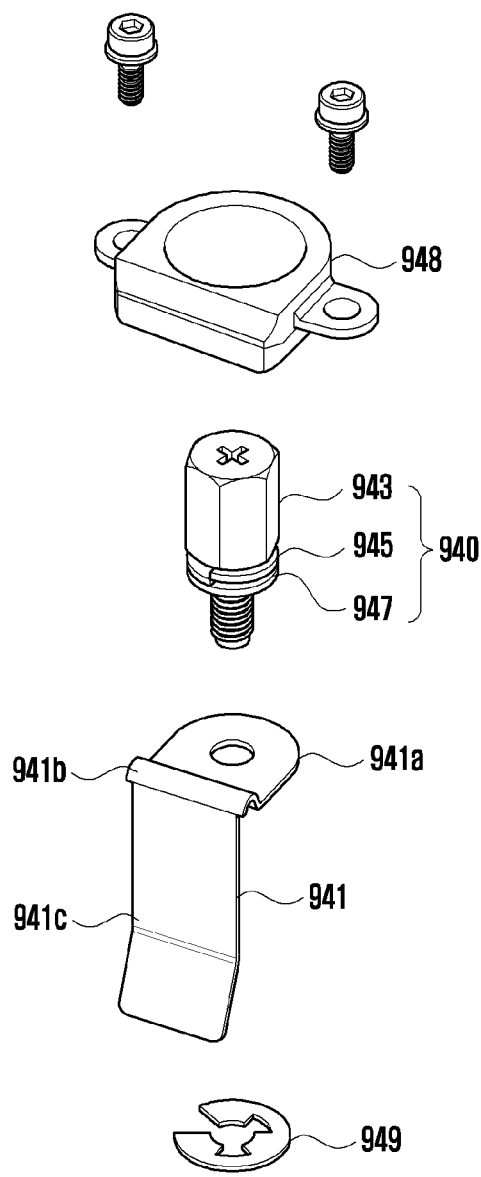
FIGS. 13A to 13D are views showing the sequence of coupling the connecting bracket to the fixing bracket according to another embodiment of the disclosure.

When the second fastening protrusion 173 of the connecting bracket 950 starts to be inserted into the second fastening groove 123 of the fixing bracket 910, as shown in FIG. 13A, the second fastening protrusion 173 can come in contact with the fixing portions 941c of the plate springs 941, as shown in FIG. 13B. Since the plate springs 941 elastically deform, when the first fastening protrusion 173 is inserted further, the fixing portions 941c of the plate springs 941 can be temporarily pushed into the second fixing groove 933. Thereafter, when the second fastening protrusion 173 is fully inserted in the second fastening groove 123, the end of the fixing portions 941c are inserted in the insertion grooves 975, so coupling of the connecting bracket 950 and the fixing bracket 910 can be completed.

In this state, even if the connecting bracket 950 is intended to be moved back upward, the connecting bracket 950 is difficult to separate because the fixing portions 941c are inserted and locked in the insertion grooves 975. In this process, even if larger force is applied to separate the connecting bracket 950, as described above, the bending portions 941b of the plate spring 941 having a predetermined radius distribute stress, so deformation is prevented and separation of the connecting bracket 950 can be prevented.

FIGS. 14A to 14D are views showing the sequence of separating the connecting bracket 950 from the fixing bracket 910 according to another embodiment of the disclosure.

When the bolt 943 of the fixing assembly 940 according to another embodiment of the disclosure is loosened, the fixing portion 941c of the plate spring 941 can be easily pulled out of the insertion groove 975 of the connecting bracket 950, so the connecting bracket 950 can be easily separated from the fixing bracket 910.

Figure 14A:
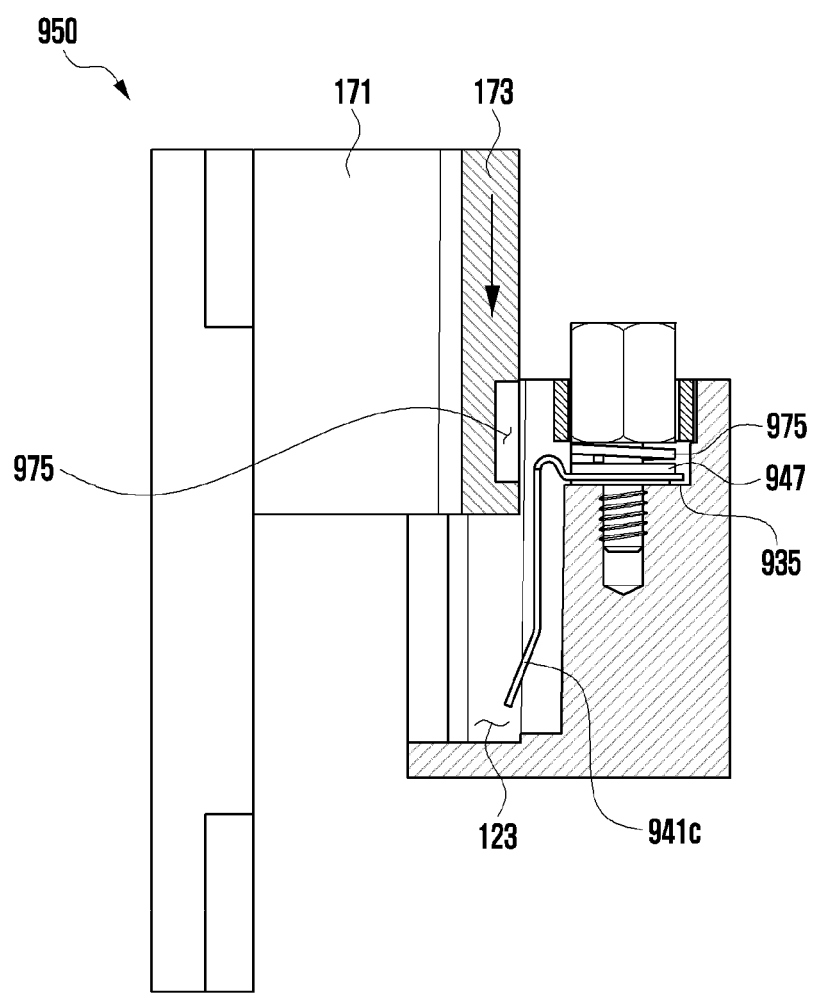
FIGS. 14A to 14D are views showing the sequence of separating the connecting bracket from the fixing bracket according to another embodiment of the disclosure.
Figure 14B:
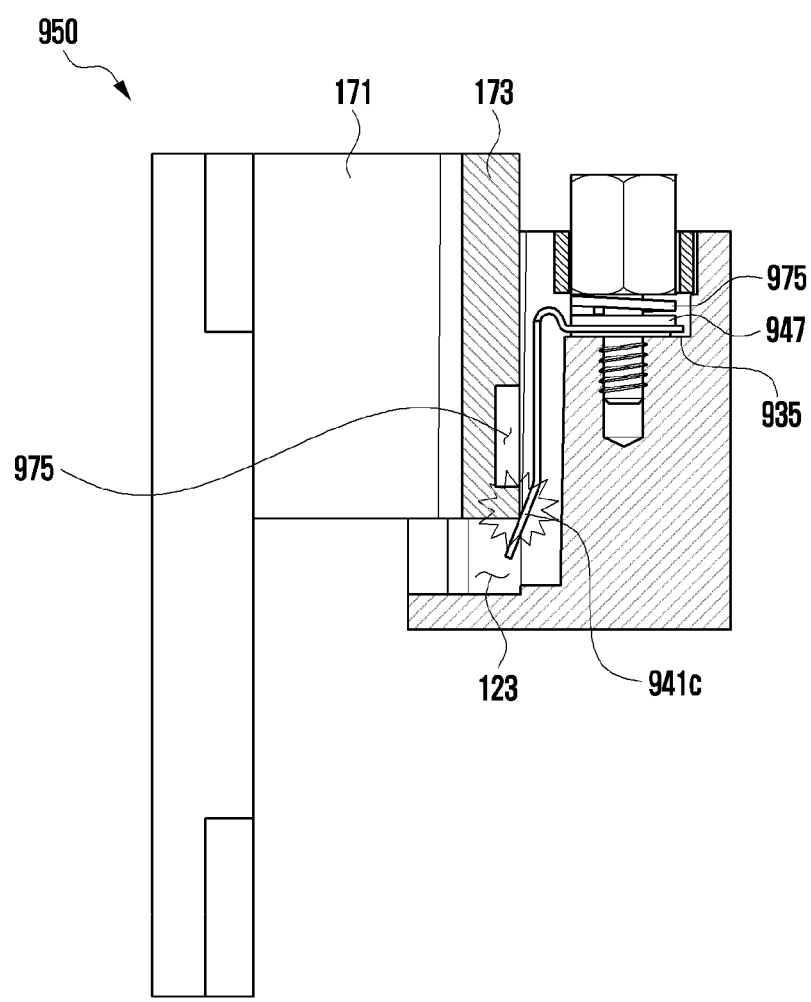
Figure 14C:
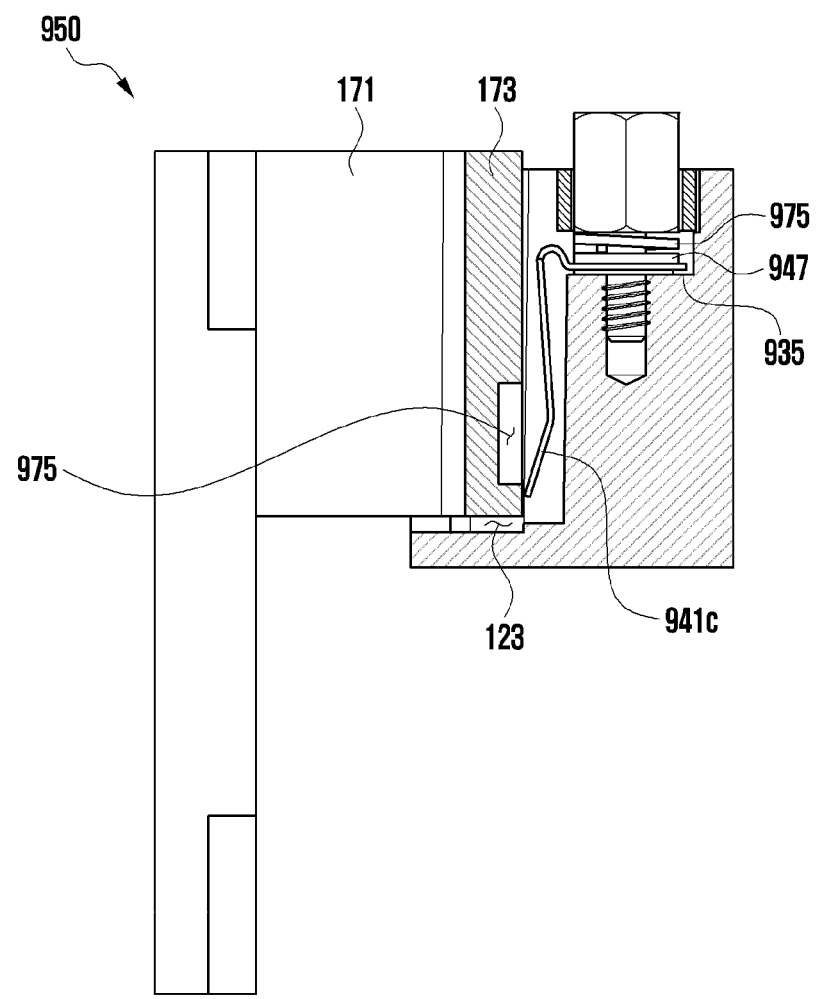
Figure 14D:
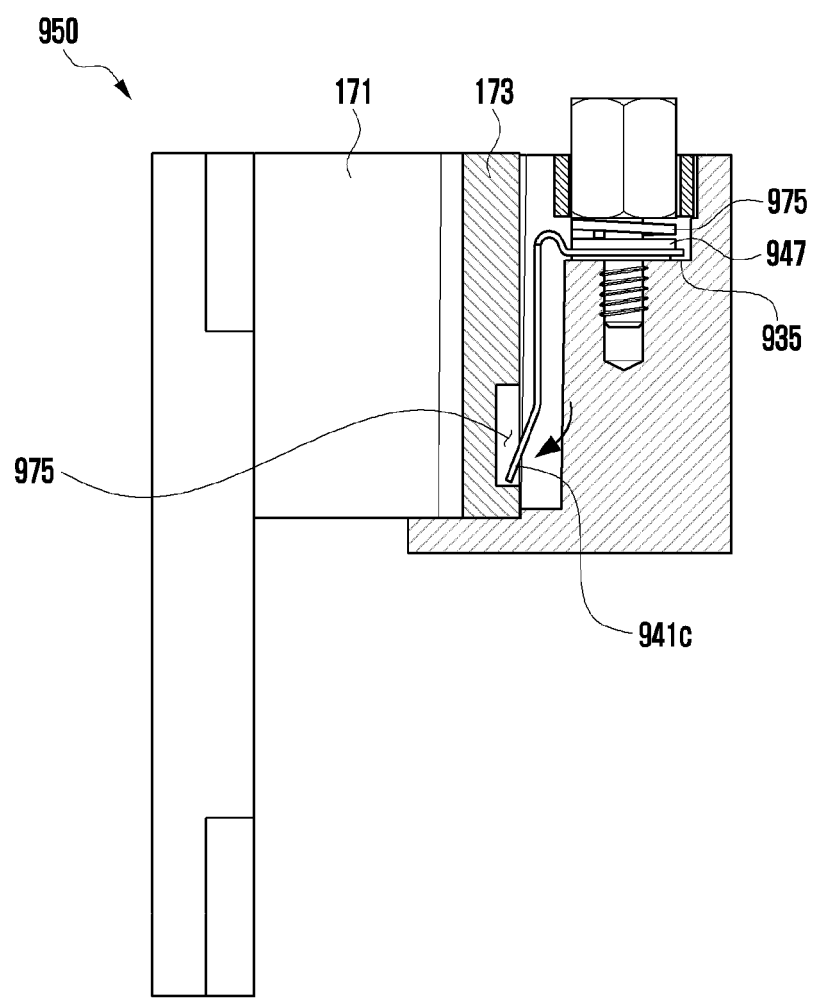

As shown in FIG. 14A, when the bolts 943 are loosened, the inserting portions 941a of the plate spring 941 can come off the locking steps 935. In this case, the center of gravity is biased by the fixing portions 941c of the plate spring 941, so the fixing portions 941c are naturally moved into the second fixing groove 933. As the bolts 943 are loosened further, the snap rings 949 pull the plate springs 941, the flat washers 947, and the spring washers 945 up to the cover blocks 948, portions of the inserting portions (941a, see FIG. 12) of the plate springs 941 and the bending portions (941b, see FIG. 12) come in contact with the bottoms of the cover blocks, and the fixing portions 941c keep inserted in the second fixing groove 933.

A device for fixing communication equipment according to an embodiment of the disclosure may include: a plurality of fixing brackets configured to coupled to a communication pole by coupling to each other around the outer surface of the communication pole; fastening grooves formed in the fixing brackets and coupled to connecting brackets; fixing grooves connected to the fastening grooves; and fixing assemblies disposed in the fixing grooves and including plate springs that protrude toward the fastening grooves or are inserted in the fixing grooves The fastening groove may include: a first fastening groove recessed on a surface toward the other surface of the fixing bracket; and a second fastening groove formed in a width direction of the fixing bracket at an end facing the other surface of the first fastening groove.

The fixing groove may be recessed in the width direction of the fixing bracket between a surface of the fixing bracket and the second fastening groove.

The fixing groove may include: a first fixing groove biased upward in a length direction of the fixing bracket; and a second fixing groove biased downward in the length direction of the fixing bracket.

The first fixing groove may be open to the top of the fixing bracket.

The first fixing groove may be recessed deeper than the second fixing groove to form a step, thereby further having a locking step formed at a joint between the first fixing groove and the second fixing groove.

The fixing assembly may further include: a bolt having a thread and spaced a predetermined distance from a head; and a spring washer fitted on the bolt.

The plate spring may have: an inserting portion having a hole to be able to be fitted on the bolt; a bending portion extending from the inserting portion and having a protrusion with a predetermined radius; and a fixing portion extending from the bending portion to protrude toward the fastening groove or to be inserted in the fixing groove.

The fixing assembly may further include a flat washer fitted on the bolt after the spring washer.

The fixing assembly may further include a snap ring configured to prevent the spring washer and the plate spring, which are fitted on the bolt, from being separated from the bolt.

The fixing bracket may have: a protrusion formed at a side in the width direction of the fixing bracket; and a groove formed at the other side in the width direction of the fixing bracket.

The plurality of fixing brackets may be coupled to each other by inserting the protrusion formed at any one fixing bracket into the groove formed at another fixing bracket.

Chain holes may be formed through the protrusion and the groove, when the protrusion formed at any one fixing bracket is inserted in the groove formed at another fixing bracket, the positions of the chain holes are aligned.

The device may further include the connecting brackets disposed around the outer surfaces of the fixing brackets and configured to be coupled to the communication equipment.

The connecting bracket may have: a base having a surface coupled to the communication equipment; and a fastening protrusion formed on the other surface of the base and inserted in the fastening groove of the fixing bracket.

The fastening protrusion may include: a first fastening protrusion formed in a length direction of the base and protruding perpendicularly from the other surface of the base; and a second fastening protrusion extending from an end of the first fastening protrusion in a width direction of the base.

The fastening protrusion may further have an insertion groove recessed on a surface of a protruding portion of the first fastening protrusion.

The fixing groove may be recessed on the second fastening groove toward the other surface of the fixing bracket.

The fastening protrusion may further have an insertion groove recessed on a surface of the second fastening protrusion and formed on a surface that is opposite a surface connected to the first fastening protrusion.

The invention claimed is:

1. A device for coupling a communication equipment, to a communication pole, the device comprising:
   a plurality of fixing brackets;
   fastening grooves formed in the fixing brackets and coupled to connecting brackets;
   fixing grooves connected to the fastening grooves; and
   fixing assemblies disposed in the fixing grooves and including plate springs that protrude toward the fastening grooves or are inserted into the fixing grooves;
   wherein each of the plurality of fixing brackets comprises:
   a chain protrusion formed at one side of the fixing bracket in a width direction of the fixing bracket; and
   a chain groove formed at another side of the fixing bracket in the width direction of the fixing bracket,
   wherein the plurality of fixing brackets are coupled to each other in a chain shape by inserting the chain protrusion of one of said fixing brackets into the chain groove of a neighboring one of said fixing brackets such that the plurality of fixing brackets are coupled to each other to surround an outer circumferential surface of the communication pole.

2. The device of claim 1, wherein the fastening groove includes:
   a first fastening groove recessed on a surface toward the other surface of the fixing bracket; and
   a second fastening groove formed in a width direction of the fixing bracket at an end facing an other surface of the first fastening groove.

3. The device of claim 2, wherein the fixing groove is recessed in the width direction of the fixing bracket between a surface of the fixing bracket and the second fastening groove.

4. The device of claim 3, wherein the fixing groove includes:
   a first fixing groove disposed relatively closer to an upper end of the fixing bracket than a lower end of the fixing bracket with respect to a length direction; and
   a second fixing groove located relatively lower than the first fixing groove with respect to the length direction of the fixing bracket.

5. The device of claim 4, wherein the first fixing groove is open to a top of the fixing bracket.

6. The device of claim 4, wherein the first fixing groove is recessed deeper than the second fixing groove to form a step, thereby further having a locking step formed at a joint between the first fixing groove and the second fixing groove.

7. The device of claim 1, wherein the fixing assembly includes:

a bolt having a thread and spaced a predetermined distance from a head; and
a spring washer fitted on the bolt.

8. The device of claim 7, wherein the plate spring has:
an inserting portion having a hole to be able to be fitted on the bolt;
a bending portion extending from the inserting portion and having a protrusion with a predetermined radius; and
a fixing portion extending from the bending portion to protrude toward the fastening groove or to be inserted in the fixing groove.

9. The device of claim 7, wherein the fixing assembly further includes a flat washer fitted on the bolt after the spring washer.

10. The device of claim 8, wherein the fixing assembly further includes a snap ring configured to prevent the spring washer and the plate spring, which are fitted on the bolt, from being separated from the bolt.

11. The device of claim 1, wherein chain holes are formed through the chain protrusion and the chain groove, and when the chain protrusion formed at any one fixing bracket is inserted in the chain groove formed at another fixing bracket, the positions of the chain holes are aligned.

12. The device of claim 1, further comprising the connecting brackets disposed around outer surfaces of the fixing brackets and configured to be coupled to the communication equipment.

13. The device of claim 12, wherein the connecting bracket has:
a base having a surface coupled to the communication equipment; and
a fastening protrusion formed on another surface of the base and inserted in the fastening groove of the fixing bracket.

14. The device of claim 13, wherein the fastening protrusion includes:
a first fastening protrusion formed in a length direction of the base and protruding perpendicularly from the other surface of the base; and
a second fastening protrusion extending from an end of the first fastening protrusion in a width direction of the base.

15. The device of claim 14, wherein the fastening protrusion further has an insertion groove recessed on a surface of a protruding portion of the first fastening protrusion.

16. The device of claim 2, wherein the fixing groove is recessed on the second fastening groove toward the other surface of the fixing bracket.

17. The device of claim 14, wherein the fastening protrusion further has an insertion groove recessed on a surface of the second fastening protrusion and formed on a surface that is opposite a surface connected to the first fastening protrusion.

* * * * *